United States Patent
Jung et al.

(10) Patent No.: US 10,108,061 B2
(45) Date of Patent: Oct. 23, 2018

(54) THIN FILM TRANSISTOR ARRAY SUBSTRATE AND LIQUID CRYSTAL DISPLAY DEVICE INCLUDING THE SAME

(71) Applicant: Samsung Display Co., Ltd., Yongin-si (KR)

(72) Inventors: Keumdong Jung, Yongin-si (KR); Daecheol Kim, Yongin-si (KR); Seongyoung Lee, Yongin-si (KR); Cholho Kim, Yongin-si (KR); Jihoon Yang, Yongin-si (KR); Hyunyoung Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 188 days.

(21) Appl. No.: 15/134,869

(22) Filed: Apr. 21, 2016

(65) Prior Publication Data
US 2017/0097550 A1     Apr. 6, 2017

(30) Foreign Application Priority Data
Oct. 1, 2015   (KR) .................. 10-2015-0138611

(51) Int. Cl.
*G02F 1/1343* (2006.01)
*G02F 1/1362* (2006.01)
*G02F 1/1333* (2006.01)
*G02F 1/1368* (2006.01)
*H01L 27/12* (2006.01)
(Continued)

(52) U.S. Cl.
CPC ...... *G02F 1/136213* (2013.01); *G02F 1/1368* (2013.01); *G02F 1/133345* (2013.01); *G02F 1/134309* (2013.01); *H01L 27/1214* (2013.01); *H01L 29/417* (2013.01); *H01L 29/94* (2013.01); *H01L 31/10* (2013.01); *G02F 2202/103* (2013.01)

(58) Field of Classification Search
CPC ......... G02F 1/136213; G02F 1/133345; G02F 1/134309; G02F 1/1368
USPC .......................................... 349/38
See application file for complete search history.

(56) References Cited

U.S. PATENT DOCUMENTS 6,515,720 B1 * 2/2003 Iizuka ............... G02F 1/136213
349/110
7,388,226 B2 * 6/2008 Kim .................. H01L 29/66765
257/59
(Continued)

FOREIGN PATENT DOCUMENTS

| KR | 10-2009-0069540 | 7/2009 |
|---|---|---|
| KR | 10-2012-0039947 | 4/2012 |
| KR | 10-2013-0046847 | 5/2013 |

*Primary Examiner* — Lucy Chien
(74) *Attorney, Agent, or Firm* — H.C. Park & Associates, PLC

(57) ABSTRACT

A thin-film transistor (TFT) array substrate includes a transistor disposed on a base substrate and a storage capacitor electrically connected to the transistor. The transistor includes a gate electrode, an active layer electrically insulated from the gate electrode, the active layer including a semiconductor material, and a first electrode and a second electrode disposed to be spaced apart from each other on the active layer. The storage capacitor includes a lower electrode including a light inflow path, and an upper electrode disposed to face the lower electrode and electrically connected to the second electrode.

20 Claims, 9 Drawing Sheets

(51) Int. Cl.
*H01L 29/417* (2006.01)
*H01L 29/94* (2006.01)
*H01L 31/10* (2006.01)

(56) References Cited

U.S. PATENT DOCUMENTS

2012/0091460 A1 4/2012 Park et al.
2013/0105801 A1 5/2013 Lee et al.
2015/0070616 A1 3/2015 Ogasawara et al.

* cited by examiner

THIN FILM TRANSISTOR ARRAY SUBSTRATE AND LIQUID CRYSTAL DISPLAY DEVICE INCLUDING THE SAME

CROSS-REFERENCE TO RELATED APPLICATION

This application claims priority from and the benefit of Korean Patent Application No. 10-2015-0138611, filed on Oct. 1, 2015, which is hereby incorporated by reference for all purposes as if fully set forth herein.

BACKGROUND

Field

Exemplary embodiments relate to a thin-film transistor (TFT) array substrate and a liquid crystal display (LCD) device including the TFT array substrate, and, more particularly, to a TFT array substrate including an active capacitor and an LCD device including the TFT array substrate.

Discussion of the Background

As various electronic devices, such as mobile phones, personal digital assistants (PDAs), computers, large televisions (TVs) develop, the demand for a flat panel display device applicable thereto may be increasing. Among the flat panel display devices, an LCD device has advantages of low power consumption, an easy moving picture display, a high contrast ratio, etc.

An LCD device may include a liquid crystal (LC) layer disposed between two display substrates. An electric field applied to the LC layer may change the arrangement direction of LC molecules therein and change the polarization direction of incident light. In this manner, an LCD device may display an image by associating the change of the polarization direction of incident light with a polarizer, and determine whether to transmit the incident light for each pixel.

An LCD device includes a display substrate, in which gate lines, data lines intersecting the gate lines, TFTs, and capacitors are disposed. When a gate-on voltage is applied to a gate line, and thus a TFT is turned on, a data voltage applied through a data line is charged to a pixel electrode through the TFT. An arrangement state of the LC layer is determined by an electric field formed between a data voltage charged in the pixel electrode and a common voltage applied to a common electrode, and the polarity of the data voltage may be changed for each frame.

A voltage that is applied to a pixel electrode may have a value that is different from a data voltage, due to a liquid crystal capacitor and/or a parasitic capacitor. The voltage difference between the voltage applied to the pixel electrode and the data voltage may be referred to as a kickback voltage.

A kickback voltage may vary, due to a change in the capacitance of a storage capacitor, the liquid crystal capacitor, and/or the parasitic capacitor, and thus, a voltage applied to the pixel electrode may vary. A voltage deviation at the pixel electrode may cause a brightness difference therein, which may generate defects in an image displayed by an LCD device, such as a vertical line-shaped stain, a flicker defect, and an afterimage. In particular, when the storage capacitor is an active capacitor including a semiconductor material, the capacitance of the storage capacitor may be changed according to a voltage and a frequency thereof, and thus, a kickback voltage may vary.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an LCD device that reduces a change in the capacitance of a storage capacitor, such that defects, such as a vertical line-shaped stain, a flicker defect, and an afterimage that may occur in an image displayed by the LCD device may be reduced.

Additional aspects will be set forth in the detailed description which follows, and, in part, will be apparent from the disclosure, or may be learned by practice of the inventive concept.

According to an exemplary embodiment of the present invention, a thin-film transistor (TFT) array substrate includes a transistor disposed on a base substrate and a storage capacitor electrically connected to the transistor. The transistor includes a gate electrode, an active layer electrically insulated from the gate electrode, the active layer including a semiconductor material, and a first electrode and a second electrode disposed to be spaced apart from each other on the active layer. The storage capacitor includes a lower electrode including a light inflow path, and an upper electrode disposed to face the lower electrode and electrically connected to the second electrode.

According to an exemplary embodiment of the present invention, a liquid crystal display (LCD) device includes a transistor disposed on a base substrate, a storage capacitor electrically connected to the transistor, a pixel electrode electrically connected to the transistor and the storage capacitor, a liquid crystal layer disposed on the pixel electrode, and a common electrode configured to apply an electric field to the liquid crystal layer along with the pixel electrode. The transistor includes a gate electrode, an active layer electrically insulated from the gate electrode and including a semiconductor material, and a first electrode and a second electrode disposed to be spaced apart from each other on the active layer. The storage capacitor includes a lower electrode including a light inflow path, and an upper electrode disposed to face the lower electrode and electrically connected to the second electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
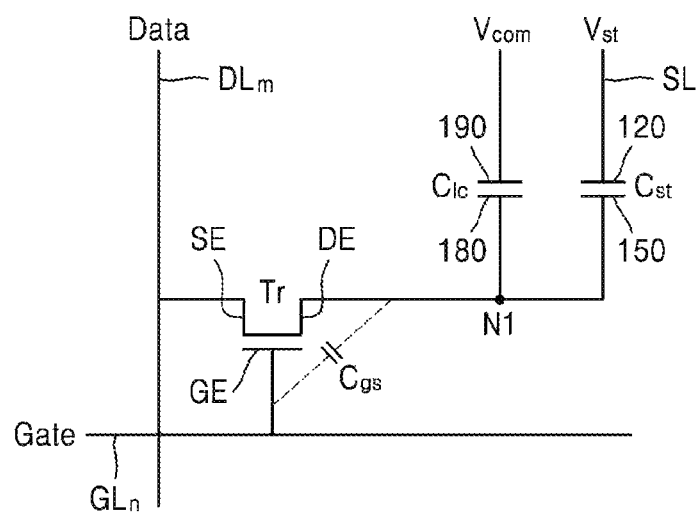
FIG. 1 is an equivalent circuit diagram of one pixel included in a liquid crystal display (LCD) device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A liquid crystal display (LCD) device according to an exemplary embodiment of the present invention includes pixels, a thin-film transistor (TFT) array substrate, an upper substrate facing the TFT array substrate, and a liquid crystal (LC) layer disposed between the TFT array substrate and the upper substrate. The TFT array substrate may include a TFT for driving each of the pixels, a capacitor, and wiring lines. The pixel may denote the smallest unit for displaying an image, and the LCD device displays an image via pixels.

FIG. 1 is an equivalent circuit diagram of one pixel included in an LCD device according to an exemplary embodiment.

An LCD device according to the present exemplary embodiment includes a display area for displaying an image and a peripheral area around the display area. Pixels are disposed in the display area, and each of the pixels may be driven by a driving circuit unit and wiring lines that apply an electrical signal to the driving circuit unit.

Referring to FIG. 1, the driving circuit unit and the wiring lines may be disposed in a TFT array substrate included in an LCD device. The driving circuit unit may include a TFT Tr and a storage capacitor $C_{st}$. The wiring lines may include a gate line $GL_n$ that applies a gate signal "Gate" to a gate electrode GE of the TFT Tr, and a data line $DL_m$ that applies a data signal "Data" to a first electrode SE of the TFT Tr.

The gate line $GL_n$ and the data line $DL_m$ may extend in first and second directions, respectively, which intersect each other. The LCD device may include gate lines $GL_n$ and data lines $DL_m$ and a pixel may be disposed in each area in which the gate lines $GL_n$ intersect the data lines $DL_m$.

When a turn-on signal is applied to the gate electrode GE of the TFT Tr, the data signal "Data" applied to the first electrode SE may be transferred to a second electrode DE of the TFT Tr. The second electrode DE of the TFT Tr may be electrically connected to an upper electrode 150 (see FIG. 3) of the storage capacitor $C_{st}$ and a pixel electrode 180 (see FIG. 3). In other words, the second electrode DE, the upper electrode 150, and the pixel electrode 180 may be connected to a first node N1.

The storage capacitor $C_{st}$ may include the upper electrode 150 and a lower electrode 120 facing the upper electrode 150, and a capacitor voltage $V_{st}$ may be applied to the lower electrode 120 via a capacitor line SL.

The LCD device may further include a common electrode 190 (see FIG. 7) to which a common voltage $V_{com}$ is applied. An electric field may be applied to a liquid crystal included in the LCD device by the common electrode 190 and the pixel electrode 180. A liquid crystal capacitor $C_{lc}$ may be formed by the pixel electrode 180 and the common electrode 190 overlapping each other.

The gate electrode GE and the second electrode DE may include an area, in which the gate electrode GE of the TFT Tr and the second electrode DE overlap each other in plan view, which may form a parasitic capacitor $C_{gs}$. Due to the parasitic capacitor $C_{gs}$, a voltage applied to the pixel electrode 180 may have a different value than a data voltage applied via the data line $DL_m$, which corresponds to an image to be implemented. As used herein, the difference between the data voltage and the voltage applied to the pixel electrode 180 may be referred to as a kickback voltage.

When a kickback voltage is changed according to a data voltage applied by the data line $DL_m$ in one pixel, or pixels disposed at different positions have different kickback voltages from each other, defects may occur in an implemented image, such as a flicker and a stain.

According to the present exemplary embodiment, the storage capacitor $C_{st}$ may be an active capacitor, in which a semiconductor layer 140a (see FIG. 3) is disposed between the lower electrode 120 and the upper electrode 150 of the storage capacitor $C_{st}$. The capacitance of the active capacitor may vary, depending on a voltage applied to the lower electrode 120 and/or the upper electrode 150. A change in the capacitance may cause a change in the kickback voltage.

Figure 3:
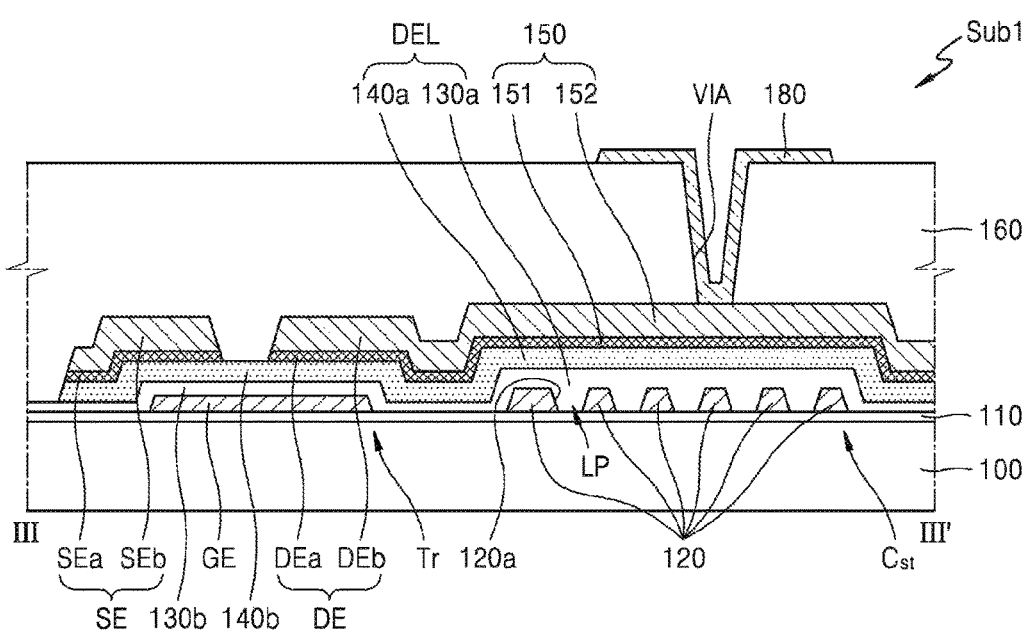
FIG. 3 is a cross-sectional view taken along line of the TFT array substrate of FIG. 2.

The lower electrode 120 of the storage capacitor $C_{st}$ may include a light inflow path LP (see FIG. 3). A change in capacitance of the storage capacitor $C_{st}$ may be reduced by the light inflow path LP, which will be described in detail below.

The first electrode SE and the second electrode DE of the TFT Tr may be a source electrode and a drain electrode, respectively. Alternatively, the LCD device may include a different type of TFT Tr, in which the first electrode SE and the second electrode DE may be a drain electrode and a source electrode, respectively.

Figure 2:
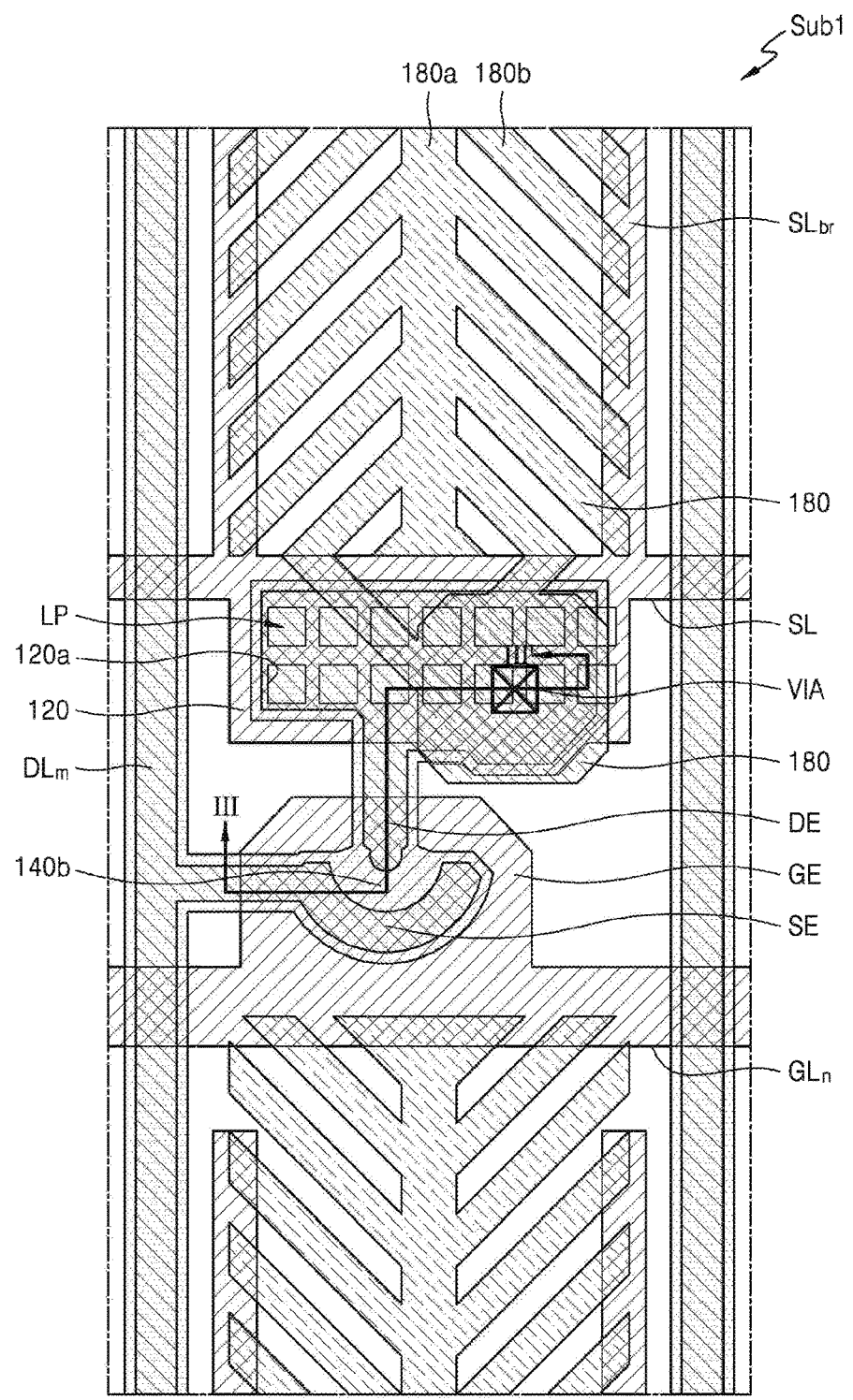
FIG. 2 is a plan view illustrating a thin-film transistor (TFT) array substrate according to an exemplary embodiment of the present invention.
Figure 4:
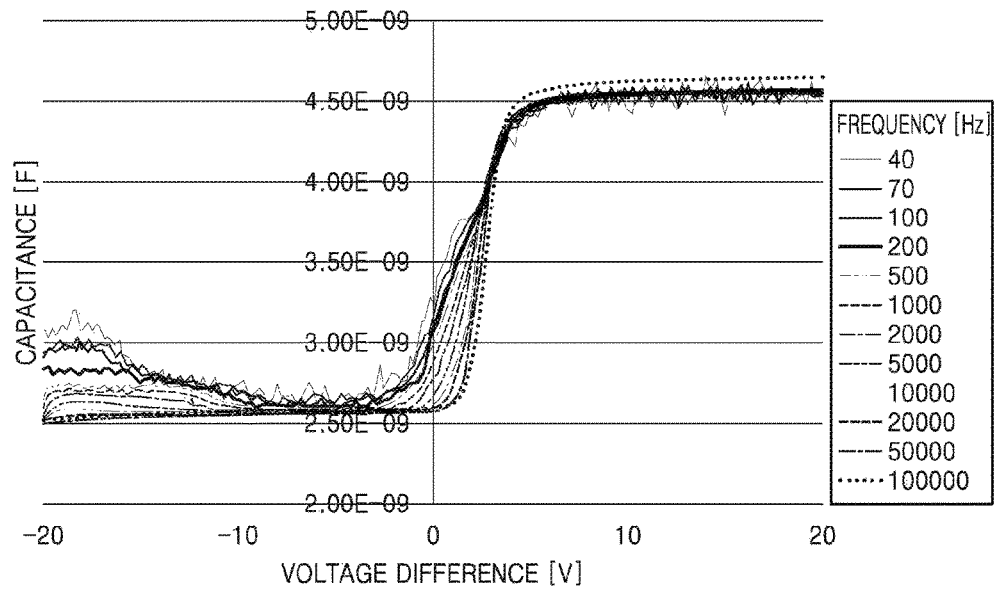
FIG. 4 illustrates graphs showing a capacitance C of a storage capacitor included in the TFT array substrate of FIG. 2 according to a voltage V, when light is not incident to the TFT array substrate and when light is incident to the TFT array substrate.
Figure 4:
Figure 4:
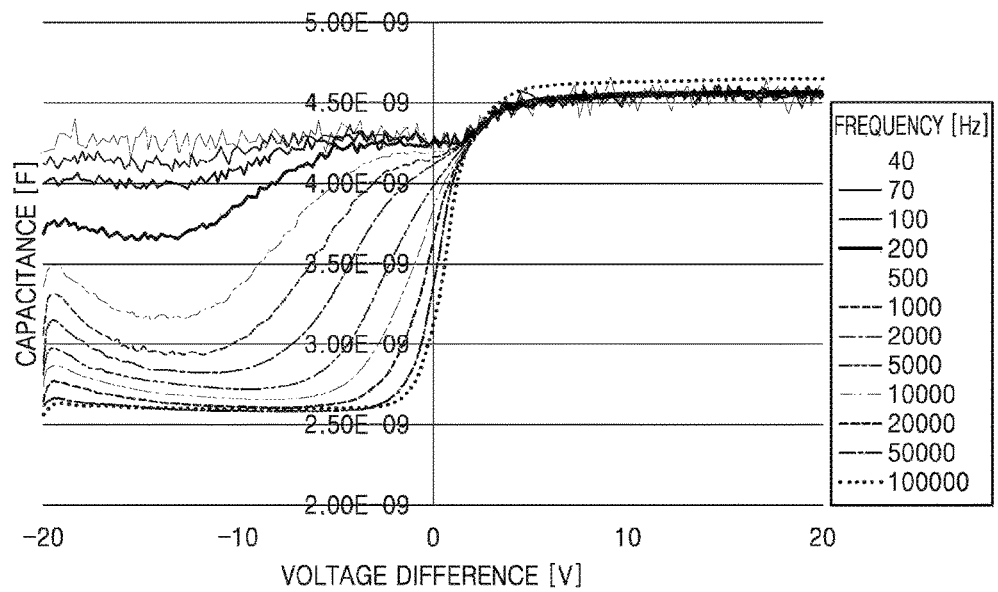

FIG. 2 is a plan view illustrating a TFT array substrate Sub1 according to an exemplary embodiment of the present invention. FIG. 3 is a cross-sectional view taken along line of the TFT array substrate Sub 1 of FIG. 2. FIG. 4 illustrates graphs showing a capacitance C of a storage capacitor included in the TFT array substrate of FIG. 2 according to a voltage V, when light is not incident to the TFT array substrate Sub1 and when light is incident to the TFT array substrate Sub1.

Referring to FIGS. 2 and 3, the TFT array substrate Sub1 may include a transistor Tr disposed on a base substrate 100 and a storage capacitor $C_{st}$ electrically connected to the transistor Tr. The transistor Tr may include a gate electrode GE, an active layer 140b electrically insulated from the gate electrode GE and including a semiconductor material, and first and second electrodes SE and DE disposed to be separate from each other on the active layer 140b. The storage capacitor $C_{st}$ may include a lower electrode 120 including a light inflow path LP and an upper electrode 150 electrically connected to the second electrode DE and disposed to face the lower electrode 120.

The base substrate 100 may include glass or plastic and be divided into pixel areas. The pixel areas may be defined by a gate line $GL_n$ extending in the first direction and a data line $DL_m$ extending in a second direction that intersects the first direction. FIG. 2 illustrates an area corresponding to portions of two adjacent pixels. It is noted that, however, the LCD device may include multiple pixel areas that are the same as or similar to pixel areas illustrated in FIG. 2, and may implement an image by using the pixel areas.

The transistor Tr may be disposed in an area of the base substrate 100. The transistor Tr may include the gate electrode GE, the active layer 140b disposed on the gate electrode GE, and the first and second electrodes SE and DE disposed to be separate from each other on the active layer 140b. According to an exemplary embodiment of the present invention, the first electrode SE and the second electrode DE may be a source electrode and a drain electrode, respectively.

A gate insulating layer 130b may be disposed between the gate electrode GE and the active layer 140b. According to an exemplary embodiment of the present invention, the active layer 140b may include amorphous silicon, and the gate insulating layer 130b may be a single layer or a multi-layer, which includes an inorganic material. According to the present exemplary embodiment, the gate insulating layer 130b may be a single layer including silicon nitride ($SiN_x$).

The first electrode SE and the second electrode DE, which are conductive, may be disposed on the active layer 140b. The first electrode SE may include a lower layer SEa and an upper layer SEb disposed on the lower layer SEa. The second electrode DE may include a lower layer DEa and an upper layer DEb disposed on the lower layer DEa. The active layer 140b may include an area between the first electrode SE and the second electrode DE spaced apart from each other, which functions as a channel that may or may not electrically connect the first electrode SE to the second electrode DE.

According to an exemplary embodiment of the present invention, the lower layer SEa of the first electrode SE and the lower layer DEa of the second electrode DE may include amorphous silicon doped with impurities, and thus having conductivity, for example, n⁺ amorphous silicon. The lower layer SEa of the first electrode SE may be an ohmic contact layer disposed between the active layer 140b and the upper layer SEb of the first electrode SE, which may reduce a work function difference between the active layer 140b and the upper layer SEb of the first electrode SE. The lower layer DEa of the second electrode DE may be an ohmic contact layer disposed between the active layer 140b and the upper layer DEb of the second electrode DE, which may reduce a work function difference between the active layer 140b and the upper layer Deb of the second electrode DE. Each of the first and second electrodes SE and DE may directly contact the active layer 140b. In other words, the active layer 140b may directly contact the lower layers SEa and DEa, and the lower layers SEa and DEa may contact the upper layers SEb and DEb, respectively.

The upper layers SEb and DEb of the first and second electrodes SE and DE may include a metal layer, which may include at least one of molybdenum (Mo), aluminum (Al), copper (Cu), and titanium (Ti). According to an exemplary embodiment of the present invention, the upper layers SEb and DEb may be double layers including Ti/Cu or triple layers including Ti/Cu/Ti.

The gate electrode GE may be a part protruding from the gate line $GL_n$, and may receive a gate signal from the gate line $GL_n$. The first electrode SE may be a part protruding from the data line $DL_m$, and may receive a data signal from the data line $DL_m$. The second electrode DE may be disposed to be separate from the first electrode SE, in which the active layer 140b including a semiconductor material is interposed between the second electrode DE and the first electrode SE. The second electrode DE may receive a data signal from the first electrode SE, when a turn-on signal is applied to the gate electrode GE.

The storage capacitor $C_{st}$ may be disposed in an area of the base substrate 100. The storage capacitor $C_{st}$ may include the lower electrode 120 and the upper electrode 150 facing the lower electrode 120. A buffer layer 110 for planarizing the base substrate 100 and blocking penetration of impurities from the base substrate 100 may be disposed between the base substrate 100 and the transistor Tr, and between the base substrate 100 and the storage capacitor $C_{st}$.

According to an exemplary embodiment of the present invention, the lower electrode 120 may be disposed on the same layer as the gate electrode GE and include the same material as the gate electrode GE. The upper electrode 150 may be disposed on the same layer as the first and second electrodes SE and DE of the transistor Tr and include the same material as the first and second electrodes SE and DE.

The upper electrode 150 may be electrically connected to the second electrode DE of the transistor Tr. According to an exemplary embodiment of the present invention, the upper electrode 150 may be an extended portion of the second electrode DE.

The upper electrode 150 may include a first layer 151 and a second layer 152. The first layer 151 may include amorphous silicon doped with impurities, thereby being conductive. The second layer 152 is disposed on the first layer 151 and includes at least one metal layer. According to an exemplary embodiment of the present invention, the first layer 151 may include n⁺ amorphous silicon, and the second layer 152 may include a metal layer including at least one of Mo, Al, Cu, and Ti, and be a single layer or a multi-layer.

A dielectric layer DEL may be disposed between the lower electrode 120 and the upper electrode 150. The capacitance of the storage capacitor $C_{st}$ may be determined depending on a refractive index of the dielectric layer DEL and the size of an overlapping area between the lower electrode 120 and the upper electrode 150. In other words, as the refractive index of the dielectric layer DEL increases, the capacitance of the storage capacitor $C_{st}$ may increase. By increasing the refractive index of the dielectric layer DEL, the capacitance of the storage capacitor $C_{st}$ may increase, even if the size of the overlapping area between the lower electrode 120 and the upper electrode 150 is not increased.

The capacitance of the storage capacitor $C_{st}$ may be about 15% or more of the total capacitance of capacitors included in the LCD device, and a kickback voltage may be equal to or less than about 2.5 volts (V).

According to an exemplary embodiment of the present invention, the dielectric layer DEL may include an insulating layer 130a and a semiconductor layer 140a, sequentially disposed on the lower electrode 120. The insulating layer 130a may be a single layer or a multi-layer, and includes an inorganic material. According to an exemplary embodiment of the present invention, the gate insulating layer 130b may be a single layer including silicon nitride $SiN_x$ and the semiconductor layer 140a may include amorphous silicon. The insulating layer 130a may be an extended part of the gate insulating layer 130b of the transistor Tr, and the semiconductor layer 140a may be an extended part of the active layer 140b of the transistor Tr.

The refractive index of the amorphous silicon included in the semiconductor layer 140a is equal to or greater than about 3.5, which may be substantially higher than that of an inorganic insulating material having a refractive index equal to or less than 2.0. Accordingly, since the storage capacitor $C_{st}$ includes the dielectric layer DEL including the semiconductor layer 140a having a relatively high refractive index, the storage capacitor $C_{st}$ may have a high capacitance in a predetermined space.

When the storage capacitor $C_{st}$ includes the dielectric layer DEL including the semiconductor layer 140a, the capacitance of the storage capacitor $C_{st}$ may vary depending on a voltage and a frequency thereof. As illustrated in an upper graph of FIG. 4, the capacitance of the storage capacitor $C_{st}$ varies as a voltage difference between a voltage applied to the lower electrode 120 and a voltage applied to the upper electrode 150 varies. The capacitance of the storage capacitor $C_{st}$ illustrated in the upper graph of FIG. 4 is measured when no light is incident to the semiconductor layer 140a, that is, in an environment in which there is no light. As illustrated in the upper graph of FIG. 4, the change in the capacitance, which depends on the voltage difference, may vary depending on a frequency of the voltage applied thereto.

The change in the capacitance of the storage capacitor $C_{st}$ may cause a change in the kickback voltage, which may vary the difference between a voltage of the pixel electrode 180 and an applied data voltage. As illustrated in a lower graph of FIG. 4, however, when light is incident to the semiconductor layer 140a, a change in the capacitance, which depends on a voltage difference, is remarkably reduced at a frequency that is equal to or less than 100 Hz. This phenomenon may occur because light incident to the semiconductor layer 140a may generate carriers therein, and thus, when a voltage applied to the semiconductor is a negative voltage, a depletion layer may not be fully formed in the semiconductor layer 140a. In this manner, the lowering of the capacitance may be decreased when a negative voltage is applied, and thus, a change in the capacitance, which depends on a voltage difference, may decrease.

Light irradiated towards the TFT array substrate Sub1 from a backlight unit BLU (see FIG. 7) may not be almost incident on the semiconductor layer 140a, due a lower electrode of the storage capacitor $C_{st}$ disposed between the base substrate 100 and the semiconductor layer 140a.

According to an exemplary embodiment of the present invention, the lower electrode 120 of the storage capacitor $C_{st}$ may include a light inflow path LP, which may provide light to the semiconductor layer 140a. The light inflow path LP may correspond to an empty space, which overlaps the upper electrode 150 in plan view, and at least a portion of the light inflow path LP may be surrounded by a material forming the lower electrode 120. In other words, since a material forming the lower electrode 120 is not disposed in the light inflow path LP, light irradiated from a backlight unit BLU may be incident on the semiconductor layer 140a through the light inflow path LP.

According to an exemplary embodiment of the present invention, the light inflow path LP may include at least one opening 120a in the lower electrode 120. The opening 120a may be formed under the upper electrode 150, that is, in an area that overlaps the upper electrode 150 in plan view. Shapes of the openings 120a and the number of openings 120a may be varied.

The lower electrode 120 may be a part protruding from a capacitor line SL extending in the first direction, and a capacitor voltage $V_{st}$ may be applied to the lower electrode 120 from the capacitor line SL. The capacitor line SL may be disposed on the same layer as the gate line $GL_n$ and extend in the same direction as the gate line $GL_n$. A branch portion $SL_{br}$ may be disposed on the base substrate 100, extend from the capacitor line SL in the second direction intersecting the first direction, and pass through an area on which the pixel electrode 180 are disposed. At least a portion of the branch portion $SL_{br}$ may be disposed to overlap at least a portion of the pixel electrode 180 in plan view, thereby forming a capacitor. The capacitor may form a portion of the storage capacitor $C_{st}$, which may increase the capacitance of the storage capacitor $C_{st}$.

A via insulating layer 160 that covers the transistor Tr and the storage capacitor $C_{st}$ may be disposed on the base substrate 100, and planarize a step that may be formed between the transistor Tr and the storage capacitor $C_{st}$. The via insulating layer 160 may include a via hole "VIA" that exposes a portion of the upper electrode 150 of the storage capacitor $C_{st}$. The pixel electrode 180 may be disposed on the via insulating layer 160, and the pixel electrode 180 may be connected to the upper electrode 150 through the via hole VIA. The pixel electrode 180 may be disposed in each pixels included in the LCD device.

The pixel electrode 180 includes a central branch portion 180a and a fine branch portion 180b extending from the central branch portion 180a. It is note that, however, the pixel electrode 180 may have various forms, such as a rectangular plate shape and a cross shape.

According to an exemplary embodiment of the present invention, the lower electrode 120 of the storage capacitor $C_{st}$ may include the light inflow path LP, which may provide a path of light towards the semiconductor layer 140a. In this manner, a change in the capacitance of the storage capacitor $C_{st}$, which is caused by a voltage difference between the lower electrode 120 and the upper electrode 150, may be reduced through the light inflow path LP. More particularly, defects in an image displayed by the LCD device, such as a vertical line-shaped stain, a flicker defect, and an afterimage may be prevented by reducing a change of a kickback voltage, which depends on a change in the capacitance of the storage capacitor $C_{st}$.

Figure 5A:
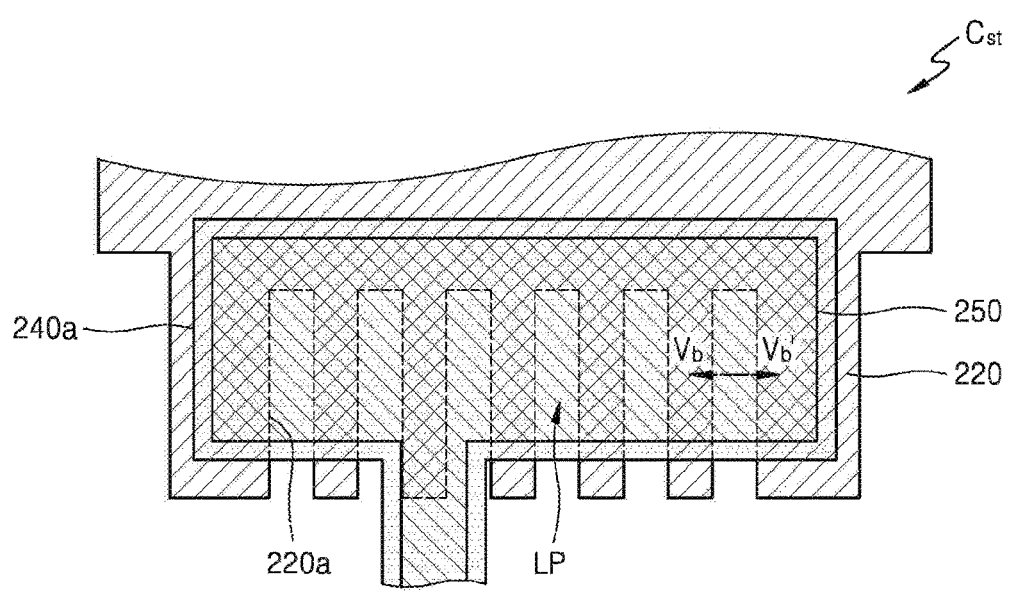
FIG. 5A is a plan view illustrating a storage capacitor included in a TFT array substrate according to an exemplary embodiment of the present invention.
Figure 5B:
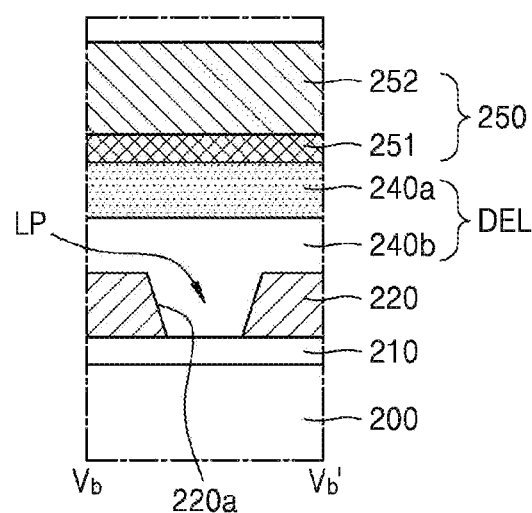
FIG. 5B is a cross-sectional view taken along line $V_b\text{-}V_b{}'$ of the storage capacitor of FIG. 5A.

FIG. 5A is a plan view illustrating a storage capacitor included in a TFT array substrate according to an exemplary embodiment of the present invention. FIG. 5B is a cross-sectional view taken along line Vb-Vb' of the storage capacitor of FIG. 5A. FIGS. 5A and 5B shows a modification of the storage capacitor $C_{st}$ included in the TFT array substrate of FIG. 3.

Referring to FIGS. 5A and 5B, according to an exemplary embodiment of the present invention, a buffer layer 210 may be disposed on a base substrate 200. A storage capacitor $C_{st}$ including a lower electrode 220 and an upper electrode 250 may be disposed on the buffer layer 210.

A dielectric layer DEL may be disposed between the lower electrode 220 and the upper electrode 250. The dielectric layer DEL includes an insulating layer 240b and a semiconductor layer 240a disposed on the insulating layer 240b. The insulating layer 240b includes silicon nitride $SiN_x$ and the semiconductor layer 240a includes amorphous silicon.

The semiconductor layer 240a has a high refractive index that is equal to or greater than about 3.5. In this manner, the storage capacitor $C_{st}$ may have a high capacitance. The upper electrode 250 may have a first layer 251 including n$^+$ amorphous silicon and a second layer 252 disposed on the first layer 251 and including at least one metal layer.

The lower electrode 220 may include a light inflow path LP, which may provide a path of light irradiated from a backlight unit BLU (see FIG. 7) to the semiconductor layer 240a. The light inflow path LP may include at least one groove 220a in the lower electrode 220, and the groove 220a may be formed under the upper electrode 250, that is, in an area that overlaps the upper electrode 250 in plan view.

According to an exemplary embodiment of the present invention, the light inflow path LP may include grooves 220a that have a tetragonal shape on an edge of the lower electrode 220. It is noted that, the shape of the light inflow path LP may vary. For example, referring to FIG. 5A, the light inflow path LP may have a finger shape in plan view.

The groove 220a may correspond to an empty space surrounded by a material forming the lower electrode 220. In this manner, light irradiated from a backlight unit BLU (see FIG. 7) may pass through the groove 220a and the light may be incident on the semiconductor layer 240a.

Figure 6A:
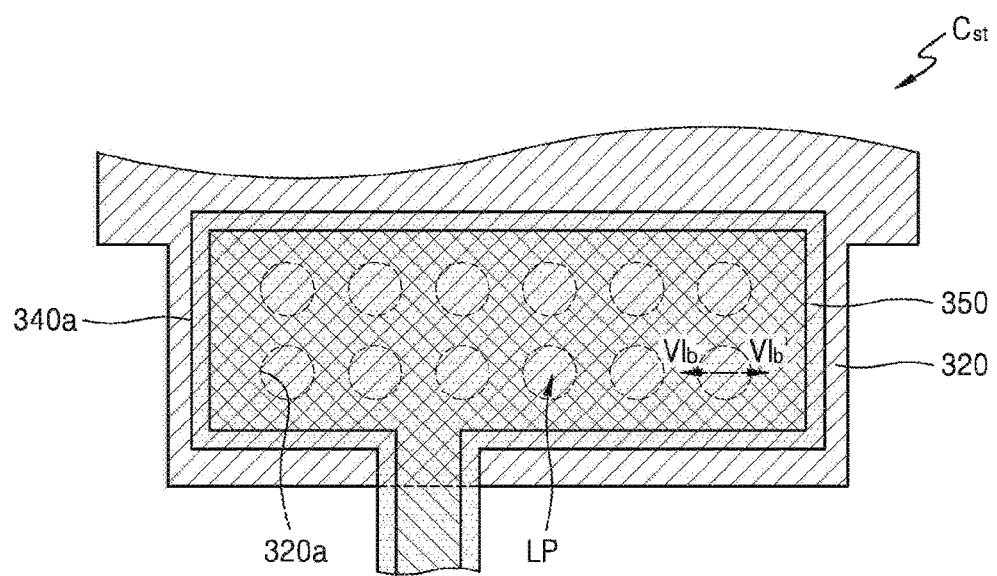
FIG. 6A is a plan view illustrating a storage capacitor included in a TFT array substrate according to an exemplary embodiment of the present invention.
Figure 6B:
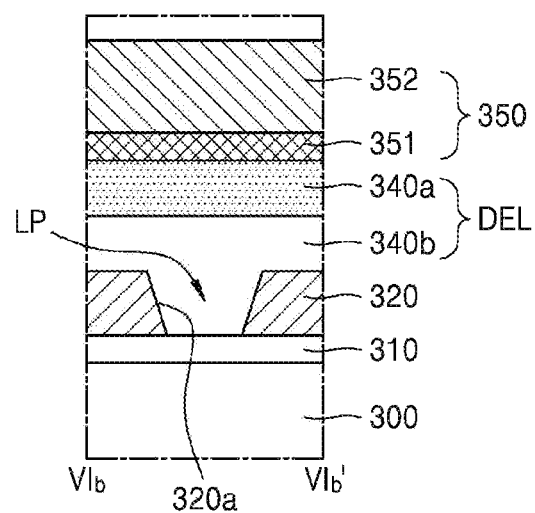
FIG. 6B is a cross-sectional view taken along line $VI_b\text{-}VI_b{}'$ of the storage capacitor of FIG. 6A.

FIG. 6A is a plan view illustrating a storage capacitor included in a TFT array substrate according to an exemplary embodiment of the present invention. FIG. 6B is a cross-sectional view taken along line $VI_b$-$VI_b$' of the storage capacitor of FIG. 6A. FIGS. 6A and 6B show a modification of the storage capacitor $C_{st}$ included in the TFT array substrate of FIG. 3.

Referring to FIGS. 6A and 6B, according to an exemplary embodiment of the present invention, a buffer layer 310 may be disposed on a base substrate 300, and a storage capacitor $C_{st}$ including a lower electrode 320 and an upper electrode 350 may be disposed on the buffer layer 310.

A dielectric layer DEL may be disposed between the lower electrode 320 and the upper electrode 350. The dielectric layer DEL includes an insulating layer 340b and a semiconductor layer 340a disposed on the insulating layer 340b. The insulating layer 340b includes silicon nitride $SiN_x$ and the semiconductor layer 340a includes amorphous silicon.

The semiconductor layer 340a has a high refractive index that is equal to or greater than about 3.5. In this manner, the storage capacitor $C_{st}$ may have a high capacitance. The upper electrode 350 may have a first layer 351 including n⁺ amorphous silicon and a second layer 352 disposed on the first layer 351 and including at least one metal layer.

The lower electrode 320 may include a light inflow path LP, which may provide a path of light irradiated through the base substrate 300 to the semiconductor layer 340*a*. The light inflow path LP may include at least one opening 320*a* in the lower electrode 320. The opening 320*a* may be formed under the upper electrode 350, that is, in an area that overlaps the upper electrode 350 in plan view.

According to an exemplary embodiment of the present invention, the light inflow path LP may include openings 320*a*, each of which has a circular shape. The opening 320*a* may correspond to an empty space surrounded by a material forming the lower electrode 320. In this manner, light irradiated from a backlight unit BLU (see FIG. 7) may pass through the opening 320*a* and the light may be incident on the semiconductor layer 340*a*.

Figure 7:
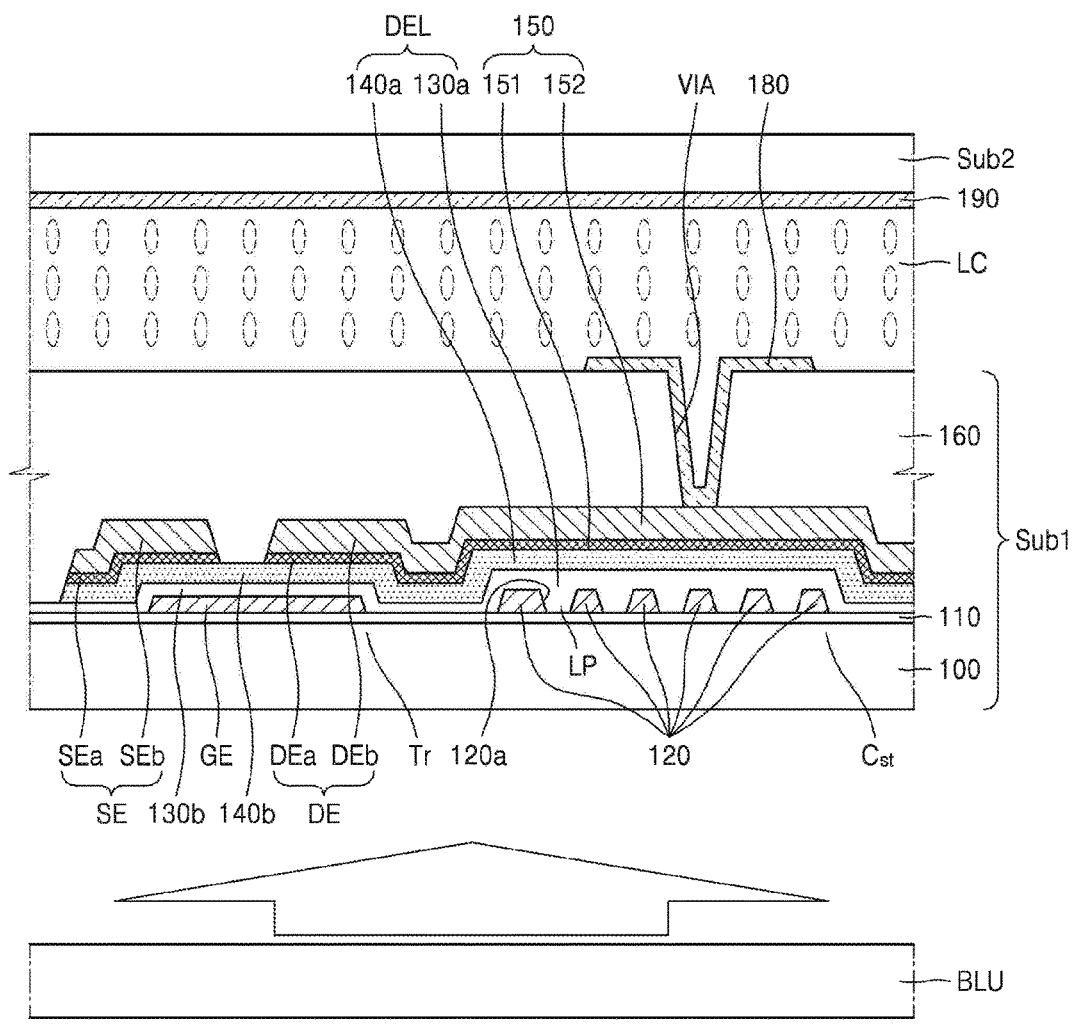
FIG. 7 is a cross-sectional view illustrating an LCD device including the TFT array substrate of FIGS. 2 and 3.

FIG. 7 is a cross-sectional view illustrating an LCD device including the TFT array substrate Sub 1 of FIGS. 2 and 3.

Referring to FIG. 7, the LCD device may include the TFT array substrate Sub 1 of FIGS. 2 and 3, a liquid crystal (LC) layer LC disposed on the TFT array substrate Sub1, and an upper substrate Sub2 for sealing the LC layer LC along with the TFT array substrate Sub1.

The LCD device may include a transistor Tr disposed on a base substrate 100, a storage capacitor $C_{st}$ electrically connected to the transistor Tr, a pixel electrode 180 electrically connected to the transistor Tr and the storage capacitor $C_{st}$, the LC layer LC disposed on the pixel electrode 180, and a common electrode 190 that applies an electric field to the LC layer LC along with the pixel electrode 180.

According to an exemplary embodiment of the present invention, the common electrode 190 may be disposed to face the pixel electrode 180 with the LC layer LC interposed therebetween. In other words, the common electrode 190 may be disposed on a surface of the upper substrate Sub2 which faces the pixel electrode 180. In this case, an electric field may be formed in a vertical direction, due to different voltages applied to the pixel electrode 180 and the common electrode 190, and thus, liquid crystals included in the LC layer LC may be aligned.

Alternatively, the common electrode 190 may be disposed to be insulated from the pixel electrode 180 in the TFT array substrate Sub1. In this case, an electric field may be formed in a horizontal direction between the common electrode 190 and the pixel electrode 180, and thus, liquid crystals included in the LC layer LC may be aligned. As described above, the pixel electrode 180 and the common electrode 190 may be disposed in various forms according to a mode for driving the LCD device.

Although not illustrated in FIG. 7, an alignment layer may be disposed on and under the LC layer LC. The alignment layer may determine an alignment direction of a liquid crystal material of the LC layer LC, when an electric field is not applied to the LC layer LC.

The LCD device may display an image in a direction of the upper substrate Sub2, and may further include a backlight unit BLU disposed in an opposite direction with respect to a direction the transistor Tr and the storage capacitor $C_{st}$ are disposed on the base substrate 100. The backlight unit BLU may irradiate light in a direction towards the base substrate 100. Light emitted from the backlight unit BLU may pass through a light inflow path LP included in a lower electrode 120 of the storage capacitor $C_{st}$ and be incident on at least a portion of a semiconductor layer 140*a*.

The transistor Tr may include a gate electrode GE, an active layer 140*b* electrically insulated from the gate electrode GE and including a semiconductor material, and first and second electrodes SE and DE disposed to be separate from each other on the active layer 140*b*. The storage capacitor $C_{st}$ may include the lower electrode 120 including the light inflow path LP and an upper electrode 150 electrically connected to the second electrode DE and disposed to face the lower electrode 120. A configuration and constituent elements of the TFT array substrate Sub1 have been described with reference to FIGS. 2 and 3, and thus, repeated descriptions thereof will be omitted.

In FIG. 7, although the storage capacitor $C_{st}$ included in the TFT array substrate Sub1 has the configuration illustrated with reference to FIGS. 2 and 3, however, the storage capacitor $C_{st}$ may alternatively have the configuration illustrated with reference to FIG. 5A or FIG. 6A.

As described above, the TFT array substrate Sub1 according to the exemplary embodiments of the present invention and the LCD device including the TFT array substrate Sub1 may include the storage capacitor $C_{st}$ having a high capacitance without an increase in size thereof, by disposing the semiconductor layer 140*a*, 240*a*, or 340*a* in the dielectric layer DEL of the storage capacitor $C_{st}$. In this manner, a high resolution LCD device may be implemented.

In addition, the TFT array substrate Sub1 according to the exemplary embodiments of the present invention and the LCD device including the TFT array substrate Sub1 may prevent defects that may occur in an image display by the LCD device, such as a vertical line-shaped stain, a flicker defect, and an afterimage, by including the light inflow path LP in the lower electrode 120, 220, or 320 of the storage capacitor $C_{st}$ to reduce a change in the capacitance of the storage capacitor $C_{st}$.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A thin-film transistor (TFT) array substrate, comprising:
   a transistor disposed on a base substrate, the transistor comprising:
      a gate electrode;
      an active layer electrically insulated from the gate electrode, the active layer comprising a semiconductor material; and
      a first electrode and a second electrode disposed to be spaced apart from each other on the active layer;
   a storage capacitor electrically connected to the transistor, the storage capacitor comprising:
      a lower electrode comprising a light inflow path; and
      an upper electrode disposed to face the lower electrode and electrically connected to the second electrode; and
   a dielectric layer disposed between the lower electrode and the upper electrode, the dielectric layer comprising an insulating layer and a semiconductor layer.

2. The TFT array substrate of claim 1, wherein:
   the insulating layer comprises silicon nitride; and
   the semiconductor layer comprises amorphous silicon.

3. The TFT array substrate of claim 1, wherein the upper electrode comprises:
   a first layer comprising doped amorphous silicon; and
   a second layer disposed on the first layer and comprising at least one metal layer.

4. The TFT array substrate of claim 1, wherein the light inflow path comprises at least one opening disposed on the lower electrode.

5. The TFT array substrate of claim 1, wherein the light inflow path comprises at least one groove disposed on the lower electrode.

6. The TFT array substrate of claim 1, wherein:
   the active layer comprises amorphous silicon; and
   each of the first and second electrodes comprises:
      a lower layer comprising doped amorphous silicon; and
      an upper layer disposed on the lower layer and comprising at least one metal layer.

7. The TFT array substrate of claim 6, wherein each of the first and second electrodes directly contacts the active layer.

8. The TFT array substrate of claim 1, wherein:
   the light inflow path corresponds to an empty space overlapping the upper electrode; and
   at least a portion of the light inflow path is surrounded by the lower electrode.

9. A liquid crystal display (LCD) device, comprising:
   a transistor disposed on a base substrate, the transistor comprising:
      a gate electrode;
      an active layer electrically insulated from the gate electrode and comprising a semiconductor material; and
      a first electrode and a second electrode disposed to be spaced apart from each other on the active layer;
   a storage capacitor electrically connected to the transistor, the storage capacitor comprising:
      a lower electrode comprising a light inflow path; and
      an upper electrode disposed to face the lower electrode and electrically connected to the second electrode;
   a pixel electrode electrically connected to the transistor and the storage capacitor;
   a liquid crystal layer disposed on the pixel electrode; and
   a common electrode configured to apply an electric field to the liquid crystal layer along with the pixel electrode,
   wherein the upper electrode comprises:
      a first layer comprising doped amorphous silicon; and
      a second layer disposed on the first layer and comprising at least one metal layer.

10. The LCD device of claim 9, further comprising a dielectric layer disposed between the lower electrode and the upper electrode,
    wherein the dielectric layer comprises an insulating layer and a semiconductor layer sequentially disposed on the lower electrode.

11. The LCD device of claim 10, wherein:
    the insulating layer comprises silicon nitride; and
    the semiconductor layer comprises amorphous silicon.

12. The LCD device of claim 9, wherein the light inflow path comprises at least one opening disposed on the lower electrode.

13. The LCD device of claim 9, wherein the light inflow path comprises at least one groove disposed on the lower electrode.

14. The LCD device of claim 9, wherein:
    the active layer comprises amorphous silicon; and
    each of the first and second electrodes comprises:
       a lower layer comprising doped amorphous silicon; and
       an upper layer disposed on the lower layer and comprising at least one metal layer.

15. The LCD device of claim 14, wherein each of the first and second electrodes directly contacts the active layer.

16. The LCD device of claim 9, wherein:
    the light inflow path corresponds to an empty space overlapping the upper electrode; and
    at least a portion of the light inflow path is surrounded by the lower electrode.

17. The LCD device of claim 9, wherein:
    the pixel electrode is electrically connected to the upper electrode; and
    the common electrode is disposed to face the pixel electrode with the liquid crystal layer disposed therebetween.

18. The LCD device of claim 10, further comprising a backlight unit disposed on an opposite side of the base substrate than the transistor and the storage capacitor, the backlight unit configured to irradiate light towards the base substrate,
    wherein light emitted from the backlight unit is configured to pass through the light inflow path and be incident on at least a portion of the semiconductor layer.

19. The TFT array substrate of claim 1, wherein the light inflow path in the lower electrode is provided in plural.

20. The TFT array substrate of claim 1, wherein the active layer is disposed between the gate electrode and at least one of the first and second electrodes.

* * * * *